United States Patent
Ota

(10) Patent No.: US 8,738,313 B2
(45) Date of Patent: May 27, 2014

(54) MEASUREMENT APPARATUS

(75) Inventor: Koji Ota, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 331 days.

(21) Appl. No.: 13/079,461

(22) Filed: Apr. 4, 2011

(65) Prior Publication Data
US 2011/0276294 A1 Nov. 10, 2011

(30) Foreign Application Priority Data
May 4, 2010 (JP) .................................. 2010-086694

(51) Int. Cl.
*G01D 18/00* (2006.01)
*H04J 3/04* (2006.01)

(52) U.S. Cl.
USPC .......................................... 702/85; 370/532

(58) Field of Classification Search
USPC ............... 702/85, 57, 64–65, 87–88, 99, 127, 702/189; 307/112–113, 115, 125, 130–131; 370/212, 431, 532–533, 535, 537–538
See application file for complete search history.

(56) References Cited

FOREIGN PATENT DOCUMENTS

JP 02216915 A * 8/1990
JP 2010-015921 A 1/2010

OTHER PUBLICATIONS

JP 02216915A (English version), Aug. 29, 1990, 10 pp.*

* cited by examiner

*Primary Examiner* — Toan Le
(74) *Attorney, Agent, or Firm* — Westerman, Hattori, Daniels & Adrian, LLP

(57) ABSTRACT

An apparatus is realized which is capable of shortening the updating period of the measurement of a specific channel and lengthening the updating period of the measurement for another channel, thereby making the measurements for all the channels possible. The measurement apparatus includes a multiplexer that sequentially switches between analog input signals of a plurality of channels and internal calibration signals; an analog-to-digital converter that converts the signals from an analog to digital form; and a digital processor to which the signals are input, wherein the digital processor includes a sequence operation unit for sequentially switching between a combination of a channel for which a high-speed update is necessary and another channel, and the internal calibration signal among the input signals of the plurality of channels and supplying, to the multiplexer, an operation signal that is input to the AD converter.

1 Claim, 4 Drawing Sheets

MEASUREMENT APPARATUS

BACKGROUND OF THE DISCLOSURE

1. Field of the Disclosure

The present disclosure relates to a measurement apparatus that sequentially switches between analog input signals of a plurality of channels and internal calibration signals using a multiplexer, performs digital conversion on the signals using an AD converter, and inputs the signals to a digital processing device.

2. Description of the Related Art

In a measurement apparatus, analog input signals of a plurality of channels are switched between by a multiplexer, digital conversion is performed by one AD converter, and the signals are input to a digital processing device, thereby decreasing the cost per channel.

FIG. 3 is a functional block diagram illustrating an example of the configuration of a measurement apparatus of the related art. A measurement apparatus 1 indicated by a block illustrated using a solid line receives signals S1 to S4 from external analog signal sources 11 to 14 indicated by channels CH1, CH2, CH3, and CH4, and signals C1 and C2 from calibration signal sources 21 and 22 indicated by calibration channels CAL1 and CAL2, and sequentially switches between these signals using a multiplexer 30.

The signals that are switched by the multiplexer 30 are sequentially converted into digital values by one AD converter 40 and are input to a digital processor 50. Signal processor 51 performs a predetermined computation process and the like, and outputs signals to an external device through output interface 52.

Signals S1 to S4 of analog signal sources 11 to 14 indicated by channels CH1 to CH4 indicate a voltage value, an electrical current value, or a resistance value indicating the measured value of the physical quantity. Signals C1 and C2 from the calibration signal sources 21 and 22 indicated by calibration channels CAL1 and CAL2 indicate zero adjustment signals, span adjustment signals, or internal terminal temperature signals.

FIG. 4 is a flowchart illustrating the operation procedure of an apparatus of the related art. In step S101, the apparatus processes an input signal of the channel CH1, processes input signals of the channels CH2 to CH4 in steps S102 to S104, respectively, and processes an internal calibration signal in step S105. The process then returns to step S101.

FIG. 5 is a flowchart illustrating the operation procedure of the apparatus of the related art. In order to shorten the time taken for the signal processing of the channel CH1, the measurement for the channels CH2 to CH4 are skipped. The apparatus processes the input signal of the channel CH1 in step S110, and processes the internal calibration signal in step S111. The process then returns to step S110.

Japanese Unexamined Patent Application Publication No. 2010-015921 is an example of related art.

SUMMARY OF THE DISCLOSURE

The apparatus of the related art has the following problems.
(1) In a case where, for example, approximately 25 ms is required to perform measurements for one channel, in the measurement by the procedure shown in FIG. 4, a measurement of four inputs+internal CAL is possible at 125 ms (25 ms×5). The updating period of the measurements for channels CH1 to CH4 requires 125 ms.
(2) In the measurement by the procedure shown in FIG. 5, measurements for the channel CH1 are possible at the updating period of 50 ms (25 ms×2), but the measurements for channels CH2 to CH4 are sacrificed. That is, a selection of either of multi-channel measurements at a slow period or few-channel measurements is forced to be made.

The present disclosure provides a measurement apparatus capable of shortening the updating period of the measurement of a specific channel and lengthening the updating period of the measurement for another channel, thereby making the measurements for all the channels possible.

In order to achieve the above-described object, according to an aspect of the present disclosure, there is provided a measurement apparatus which includes a plurality of channels for inputting signals; a multiplexer that sequentially switches between a first signal and a second signal; sequence-operation means for controlling the switching performed by said multiplexer; an AD converter that performs AD conversion of said first signal or second signal which is selected by said multiplexer; and a digital processor that performs calculation of an output from said AD converter.

The first signal is a signal of an input channel for which a high-speed update is necessary. The second signal is a signal of an input channel, for which a high-speed update is unnecessary, or an internal calibration signal.

In the measurement apparatus, the internal calibration signals are at least one of zero adjustment signals, span adjustment signals, and internal terminal temperature signals.

According to the present disclosure, the following advantages can be expected.
(1) In a case where, for example, approximately 25 ms is required to perform a measurement for one channel, measurements for a specific channel CH1 are possible at an updating period of 50 ms (25 ms×2).
(2) In a case where a measurement of internal calibration is to be performed for two channels, the updating period of the other channels CH2 to CH4 is 250 ms (25 ms×10). And it enables measurements for all the channels without sacrificing the measurements for the other channels CH2 to CH4, which was not possible with the procedure shown in FIG. 5.
(3) In an actual measurement site, a short updating period for all the channels is not necessary. For example, a short updating period is necessary for a measurement of a voltage that changes violently. However, for a measurement of a temperature that changes slowly, the updating period may be allowed to be longer.

DESCRIPTION OF SOME EMBODIMENTS

Figure 1:
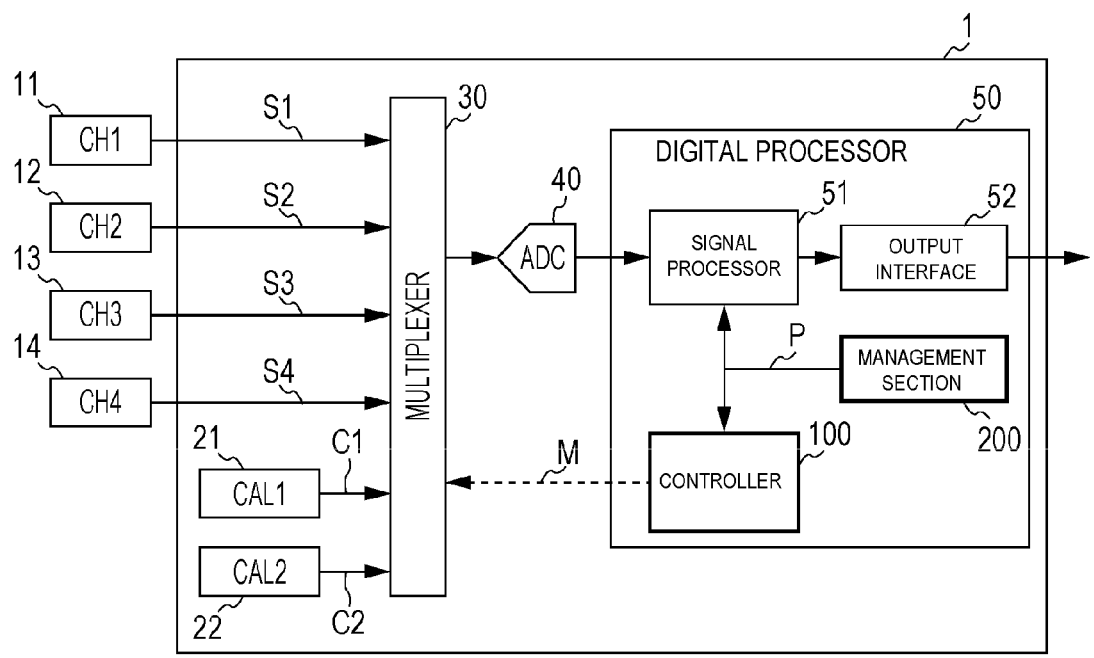
FIG. 1 is a functional block diagram illustrating an embodiment of a measurement apparatus to which the present disclosure is applied.

Embodiments of the present disclosure will be described below in detail with reference to the drawings. FIG. 1 is a functional block diagram illustrating an embodiment of a measurement apparatus to which the present disclosure is applied. Components, which are identical to the components described in FIG. 3, are designated with the same reference numerals, and thus, descriptions thereof are omitted.

Figure 3:
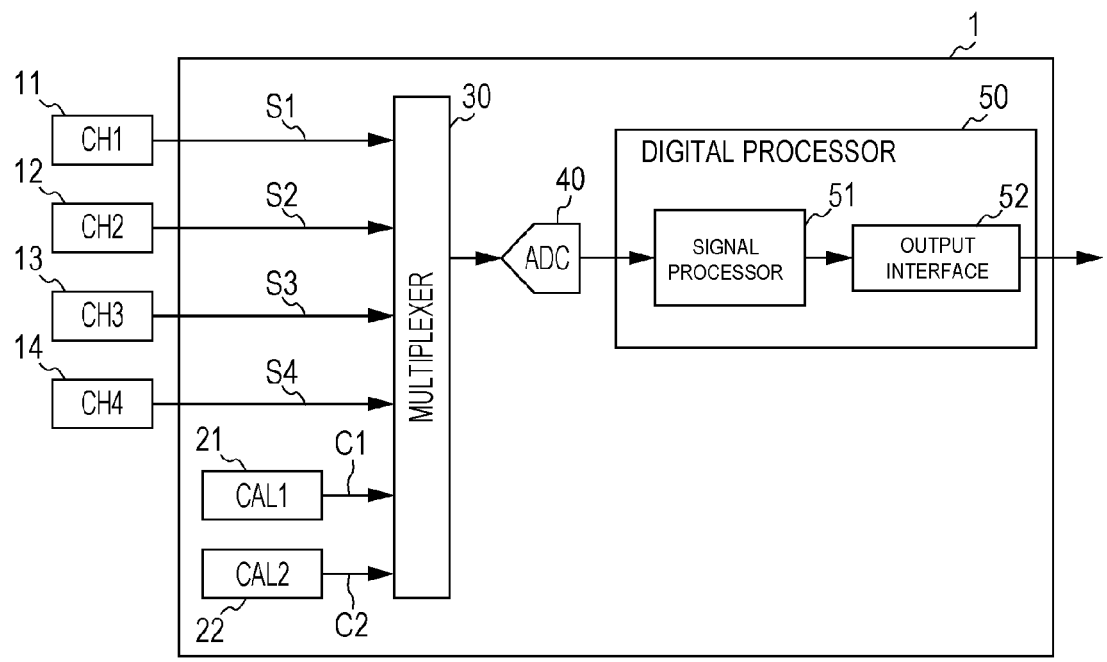
FIG. 3 is a functional block diagram illustrating an example of the configuration of a measurement apparatus of the related art.
Figure 4:
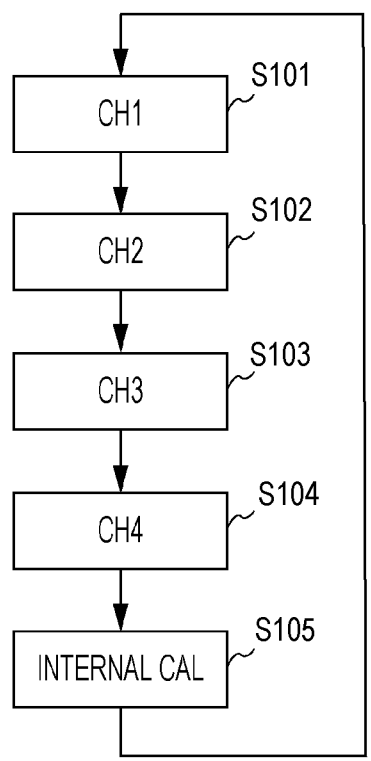
FIG. 4 is a flowchart illustrating the operation procedure of the apparatus of the related art.
Figure 5:
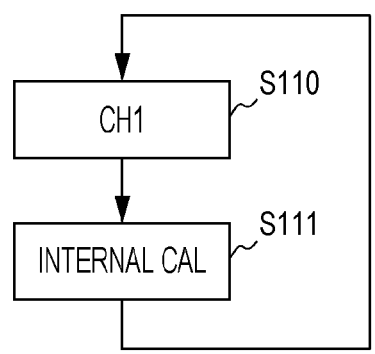
FIG. 5 is another flowchart illustrating the operation procedure of the apparatus of the related art.

The features of the present disclosure, which are added to the configuration of the related art of FIG. 3, are a configuration including controller 100 that controls the switching of a multiplexer 30, and management section 200 as functions of a digital processor 50.

The controller 100 supplies, to the multiplexer 30, an operation signal M for sequentially switching between a combination of signals of a channel CH1 requiring a high-speed update and the other channels CH2 to CH4 among the input signals of a plurality of channels, and internal calibration signals CAL1 and CAL2, and for inputting the signals to the AD converter 40.

The management section 200 supplies a signal processing start/stop instruction P to the controller 100 and the signal processor 51.

Figure 2:
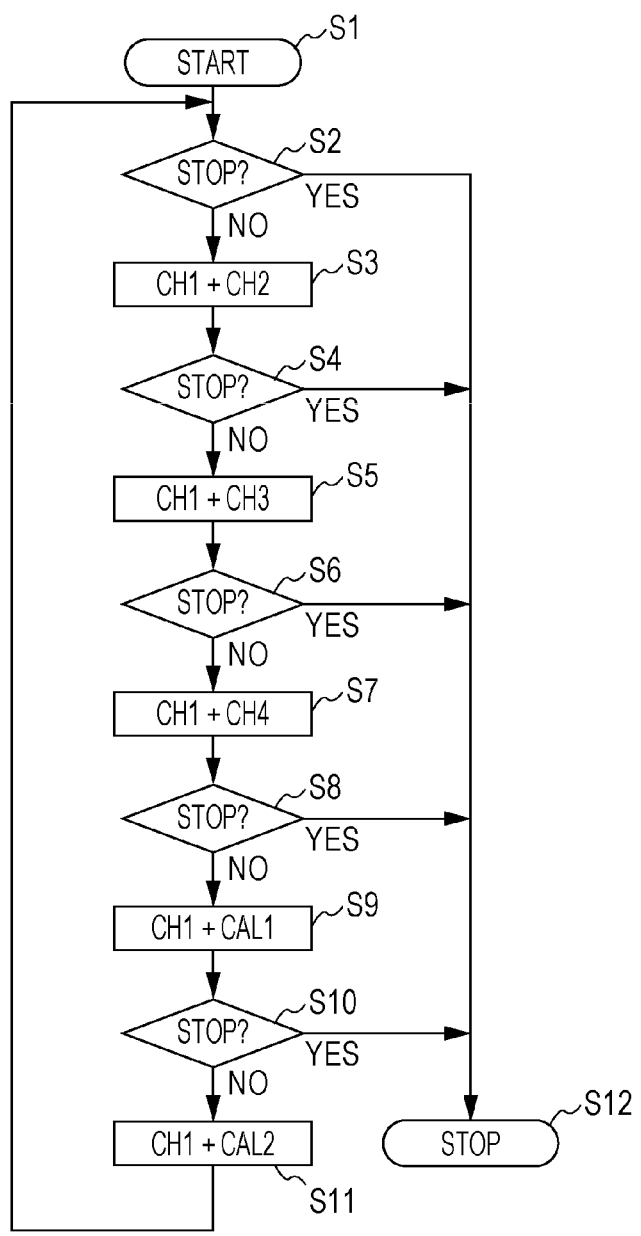
FIG. 2 is a flowchart illustrating the operation procedure of an apparatus according to the present disclosure.

FIG. 2 is a flowchart illustrating the operation procedure of the apparatus of the present disclosure. In step S1, a measurement is started. When it is determined in step S2 that the instruction is not a stop instruction, a measurement for the channel CH1 requiring a high-speed update is performed, and then a measurement for another channel CH2 is performed in step S3.

When it is determined in step S4 that the instruction is not a stop instruction, a measurement for the channel CH1 requiring a high-speed update is performed, and then a measurement for another channel CH3 is performed in step S5.

When it is determined in step S6 that the instruction is not a stop instruction, a measurement for the channel CH1 requiring a high-speed update is performed, and then a measurement for another channel CH4 is performed in step S7.

When it is determined in step S8 that the instruction is not a stop instruction, a measurement for the channel CH1 requiring a high-speed update is performed, and then an internal calibration channel CAL1 is measured in step S9.

When it is determined in step S10 that the instruction is not a stop instruction, a measurement for the channel CH1 requiring a high-speed update is performed, and then an internal calibration channel CAL2 is measured in step S11. The process then returns to step S2.

If there is a stop instruction in the determination of steps S2, S4, S6, S8, or S10, the process skips to step S12, and the measurements are completed.

In the present embodiment, the channel for which a high-speed update is performed is set as one channel CH1. The plurality of channels may be divided into a group for which a high-speed update is performed and another group, so that after the measurement for a channel requiring a high-speed update is completed, the measurement for another channel and the measurement of an internal calibration signal are sequentially performed.

For the internal calibration channel, the channel CAL1 for a zero adjustment signal and the channel CAL2 for a span adjustment signal are shown. However, the internal calibration channel may be either of them.

What is claimed is:

1. A measurement apparatus comprising:
   a plurality of channels for inputting signals;
   a multiplexer that sequentially switches between a first signal and a second signal of said signals;
   sequence-operation means for controlling said switching performed by said multiplexer;
   an AD converter that performs AD conversion of said first signal or second signal which is selected by said multiplexer; and
   a digital processor that performs measurement of at least one of the channels based on an output from said AD converter,
   wherein said first signal is a signal of an input channel for which a high-speed update is necessary,
   wherein said second signal is a signal of an input channel, for which a high-speed update is unnecessary, or an internal calibration signal which is at least one of a zero adjustment signal, a span adjustment signal, and an internal terminal temperature signal, and
   wherein said digital processor performs measurement of the channels for at least two pairs of said first and second signals, one pair including said first signal and said second signal that is the signal of the input channel for which the high-speed update is unnecessary and another pair including said first signal and said second signal that is the internal calibration signal.

* * * * *